(12) United States Patent
Lee et al.

(10) Patent No.: US 7,561,488 B2
(45) Date of Patent: Jul. 14, 2009

(54) WORDLINE DRIVING CIRCUIT AND METHOD FOR SEMICONDUCTOR MEMORY

(75) Inventors: Hong-Jun Lee, Suwon-si (KR); Tai-Young Ko, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 127 days.

(21) Appl. No.: 11/835,766

(22) Filed: Aug. 8, 2007

(65) Prior Publication Data

US 2008/0080296 A1    Apr. 3, 2008

(30) Foreign Application Priority Data

Aug. 11, 2006  (KR) ..................... 10-2006-0076265

(51) Int. Cl.
  *G11C 8/00*    (2006.01)
  *G11C 7/00*    (2006.01)
(52) U.S. Cl. .................... 365/230.06; 365/189.11; 365/194; 365/230.08
(58) Field of Classification Search ................. 365/191, 365/194, 189.11, 230.06, 230.08, 233.15
  See application file for complete search history.

(56) References Cited

U.S. PATENT DOCUMENTS

| | | | |
|---|---|---|---|
| 5,345,574 A * | 9/1994 | Sakurada et al. ............ | 711/115 |
| 6,333,874 B2 | 12/2001 | Yamauchi | |
| 6,791,897 B2 | 9/2004 | Choi | |
| 7,079,443 B2 * | 7/2006 | Takita et al. ........... | 365/230.06 |
| 2004/0196724 A1 * | 10/2004 | Chen et al. ............. | 365/230.05 |
| 2005/0105322 A1 | 5/2005 | Kobayashi et al. | |

FOREIGN PATENT DOCUMENTS

| | | |
|---|---|---|
| JP | 2004-039204 | 2/2004 |
| JP | 2005-032404 | 2/2005 |
| JP | 2005-158223 | 6/2005 |
| KR | 1020010106172 A | 11/2001 |
| KR | 1020030056185 A | 7/2003 |
| KR | 1020040004813 A | 1/2004 |

* cited by examiner

*Primary Examiner*—Ly D Pham
(74) *Attorney, Agent, or Firm*—F. Chau & Assoc., LLC

(57) ABSTRACT

Provided is a wordline driving circuit and method for a semiconductor memory, in which the wordline driving circuit includes an address decoding signal generator and a wordline voltage supplier. The address decoding signal generator receives a first row address decoding signal (URA) and generates a delayed URA signal (PXID). The wordline voltage supplier has a pull-up transistor for providing the PXID signal to a selected wordline in response to a second row address decoding signal (LRA). The address decoding signal generator sets the PXID signal to a floating state before the selection of the wordline to prevent a leakage current from flowing through the pull-up transistor in a standby mode.

12 Claims, 3 Drawing Sheets

WORDLINE DRIVING CIRCUIT AND METHOD FOR SEMICONDUCTOR MEMORY

CROSS-REFERENCE TO RELATED APPLICATION

This U.S. non-provisional patent application claims priority under 35 U.S.C. § 119 of Korean Patent Application No. 2006-76265, filed on Aug. 11, 2006, the entire contents of which are hereby incorporated by reference.

BACKGROUND OF THE INVENTION

The present disclosure relates to a semiconductor memory and, more particularly, to a wordline driving circuit and method for a semiconductor memory.

Semiconductor memories are devices in which data can be stored and from which the stored data can be read as necessary. The semiconductor memories can be classified into a random access memory (RAM) and a read only memory (ROM). The RAM is a volatile memory that needs power supplied to it to retain data. The ROM is a nonvolatile memory that can retain data even without power supply. Examples of the RAM are a dynamic RAM (DRAM) and a static RAM (SRAM). Examples of the ROM are a programmable ROM (PROM), an erasable PROM (EPROM), an electrically EPROM (EEPROM), and a flash memory.

A semiconductor memory includes a cell array with a plurality of memory cells. Each of the memory cells is connected to a wordline and a bitline. The semiconductor memory includes a wordline driving circuit for supplying a wordline voltage to a selected wordline. For example, a DRAM cell includes a capacitor and a metal oxide semiconductor (MOS) transistor. A wordline is connected to a gate of the MOS transistor. A wordline voltage, provided to the gate of the MOS transistor, is provided from a wordline driving circuit.

With the increase in the integration and speed of the semiconductor memory, a high voltage (VPP) level in the semiconductor memory increasingly affects the reliability of the semiconductor memory. In order to have a high reliability of the semiconductor memory, the VPP level must be controlled and prevented from being unintentionally reduced due to, for example, a leakage current.

The wordline driving circuit of the semiconductor memory includes a pull-up driver for supplying a high voltage to a selected wordline. Generally, the pull-up driver includes a PMOS transistor. In a standby state, a source and a drain of the PMOS transistor are set to a low level. In this case, when a high voltage is applied to a gate of the PMOS transistor, a leakage current is generated due to gate-induced drain leakage (GIDL).

As well known to those of ordinary skill in the art, when a high voltage is applied to a gate of the MOS transistor and a low-level voltage is applied to a source and a drain of the MOS transistor, GIDL occurs to generate a leakage current, referred to as a GIDL current. The GIDL current degrades the driving performance of the wordline driving circuit. Furthermore, the influence of the GIDL current on the wordline driving circuit increases with the high integration of the semiconductor memory.

SUMMARY OF THE INVENTION

Exemplary embodiments of the present invention provide a wordline driving circuit and method for a semiconductor memory that can reduce the influence due to a GIDL current in a standby state.

Exemplary embodiments of the present invention provide wordline driving circuits for a semiconductor memory, including: an address decoding signal generator receiving a first row address decoding signal (URA signal) and generating a delayed URA signal (PXID signal); and a wordline voltage supplier having a pull-up transistor for providing the PXID signal to a selected wordline in response to a second row address decoding signal (LRA signal), wherein the address decoding signal generator sets the PXID signal to a floating state before the selection of the wordline to prevent a leakage current from flowing through the pull-up transistor in a standby mode.

In exemplary embodiments, the address decoding signal generator includes an inverter chain. The inverter chain sets the PXID signal to a floating state in response to a control signal generated by the URA signal. The inverter chain generates the URA signal, the PXID signal, and an inverted PXID signal (PXIB signal).

In exemplary embodiments, the inverter chain includes a first inverter and a second inverter. The first inverter includes a first PMOS transistor and a first NMOS transistor to receive the URA signal and generate the PXIB signal. The second inverter includes a second PMOS transistor and a second NMOS transistor to receive the PXIB signal and generate the PXID signal. The second inverter further includes a MOS transistor, which may he an NMOS or a PMOS transistor, connected between the second PMOS transistor and the second NMOS transistor to set the PXID signal to a floating state in response to the control signal. The PXID signal is set to a low level when the control signal changes from low level to high level according to the URA signal.

In exemplary embodiments, the pull-up transistor is a PMOS transistor, and the semiconductor memory is a DRAM.

Exemplary embodiments of the present invention provide wordline driving methods for a semiconductor memory that includes an address decoding signal generator receiving a first row address decoding signal (URA signal) and generating a delayed URA signal (PXID signal), and a wordline voltage supplier having a pull-up transistor for providing the PXID signal to a selected wordline in response to a second row address decoding signal (LRA signal). The wordline driving methods include: setting the PXID signal to a floating state before the selection of the wordline to prevent a leakage current from flowing through the pull-up transistor in a standby mode; setting the PXID signal to a low level in response to a control signal generated by the URA signal; and setting the PXID signal to a high level by the URA signal and driving the selected wordline.

BRIEF DESCRIPTION OF THE FIGURES

Exemplary embodiments of the present invention will be understood in more detail from the following descriptions taken in conjunction with the accompanying figures. In the figures.

DETAILED DESCRIPTION OF EXEMPLARY EMBODIMENTS

Exemplary embodiments of the present invention will be described below in more detail with reference to the accompanying drawings. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those of ordinary skill in the art.

Figure 1:
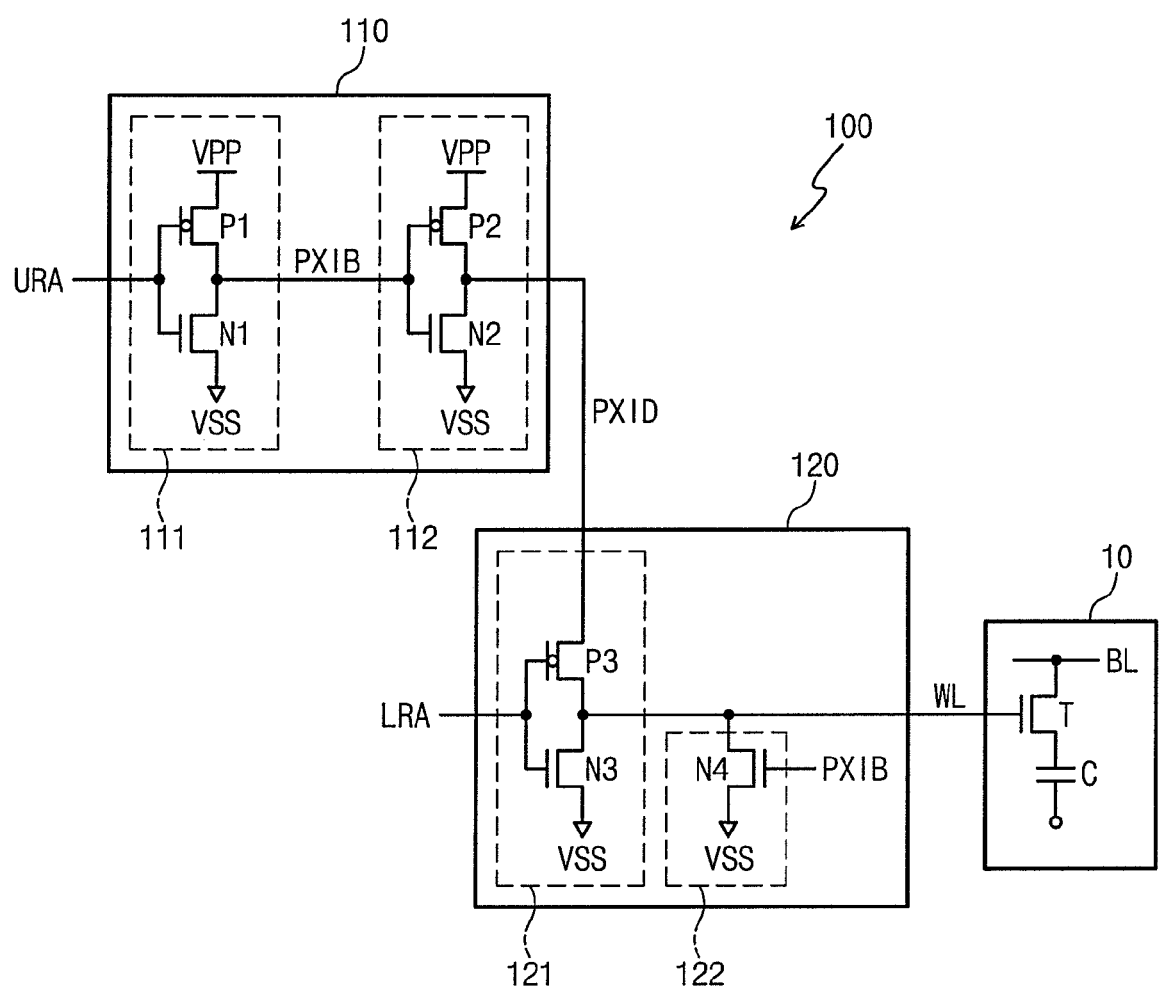
FIG. 1 is a circuit diagram of a general wordline driving circuit.

FIG. 1 is a circuit diagram of a general wordline driving circuit, which is provided to facilitate understanding of the present invention.

Referring to FIG. 1, a wordline driving circuit 100 provides a wordline voltage to a DRAM cell 10.

The DRAM cell 10 includes a cell transistor T and a cell capacitor C. A bitline BL is connected to a drain of the cell transistor T and a wordline WL is connected to a gate of the cell transistor T. The wordline driving circuit 100 provides the wordline voltage through the wordline WL to the DRAM cell 10.

The wordline driving circuit 100 includes an address decoding signal generator 110 and a wordline voltage supplier 120. The address decoding signal generator 110 receives an upper row address decoding signal, referred to as a URA signal, whereas the wordline voltage supplier 120 receives a lower row address decoding signal, referred to as a LRA signal.

The address decoding signal generator 110 receives the URA signal and generates a delayed URA signal, referred to as a PXID signal. The address decoding signal generator 110 includes an inverter chain having first and second inverters 111 and 112.

The first inverter 111 includes a PMOS transistor P1 and an NMOS transistor N1. The first inverter 111 receives the URA signal and outputs an inverted PXID signal, referred to as a PXIB signal that is opposite in phase to the URA signal. The second inverter 112 includes a PMOS transistor P2 and an NMOS transistor N2. The second inverter 112 receives the PXIB signal and outputs the PXID signal. In general, the URA signal is decoded into row addresses RA0 and RA1.

The wordline voltage supplier 120 includes an inverter 121 and a reset circuit 122. The inverter 121 receives the LRA signal and provides the wordline voltage to the wordline WL. The inverter 121 includes a PMOS transistor P3 and an NMOS transistor N3. The PMOS transistor P3 has a source receiving the PXID signal, a gate receiving the LRA signal, and a drain connected to the wordline WL. The NMOS transistor N3 has a source connected to the wordline WL, a gate receiving the LRA signal, and a drain connected to the ground terminal.

The reset circuit 122 includes an NMOS transistor N4. The NMOS transistor N4 has a source connected to the wordline WL, a gate receiving the PXIB signal, and a drain connected to the ground terminal.

In order to provide the wordline voltage to the wordline WL, the URA signal must be set to a high level and the LRA signal must be set to a low level. At this point, the PXIB signal has a low level and the PXID signal has a high level. Because the PXIB signal has a low level, the NMOS transistor N4 is turned off. Accordingly, the wordline voltage is not discharged through the NMOS transistor N4. In general, the LRA signal is decoded into the remaining addresses RA2~RAn other than the row addresses RA0 and RA1.

In a standby mode, the URA signal and the PXID signal are set to a low level and the LRA signal and the PXIB signal are set to a high level. That is, the source and the drain of the PMOS transistor P3 become a low level and the gate of the PMOS transistor P3 becomes a high level. A GIDL current may be generated under the above bias conditions of the PMOS transistor P3. The GIDL degrades the driving performance of the wordline driving circuit 100.

Figure 2:
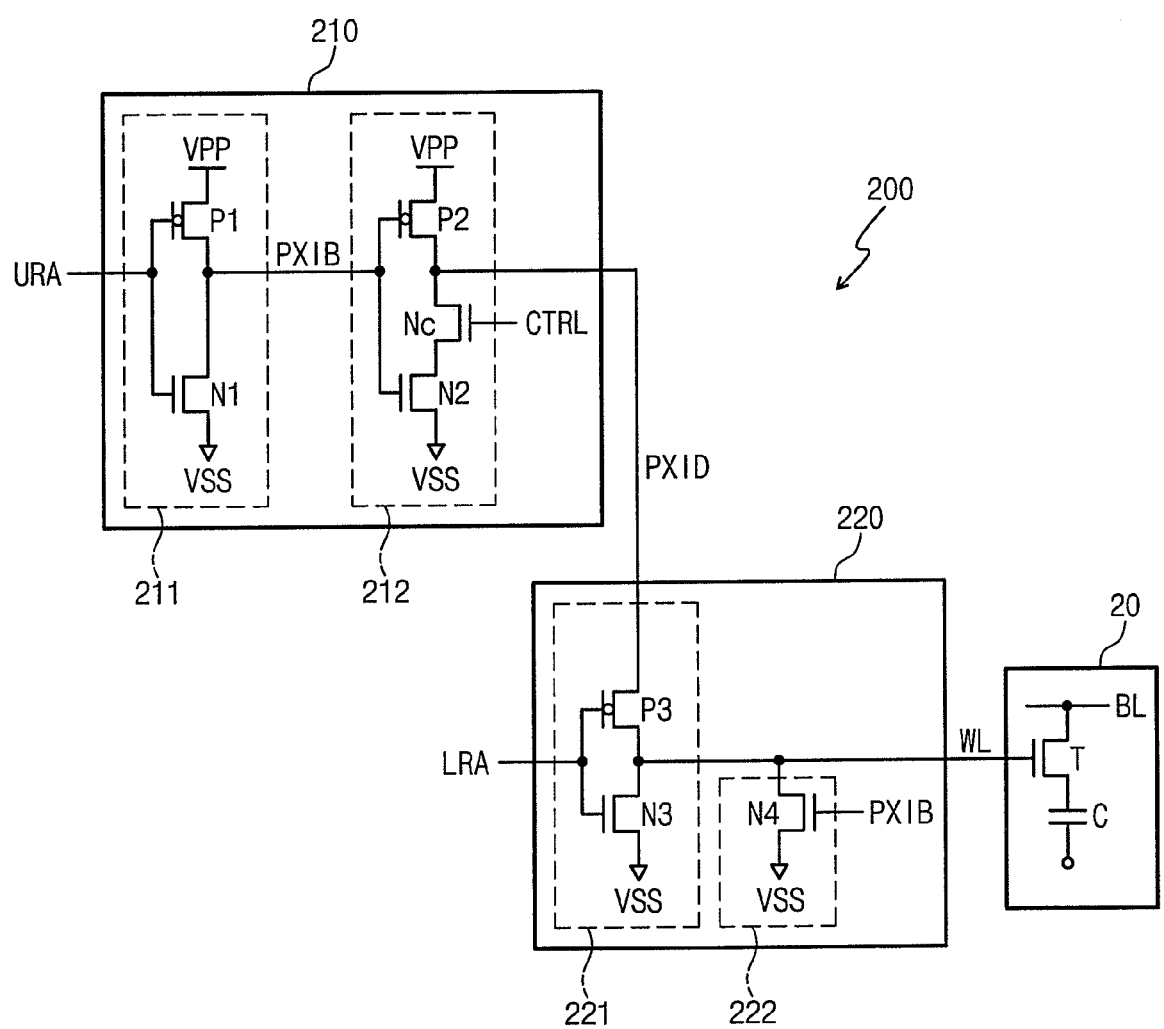
FIG. 2 is a circuit diagram of a wordline driving circuit according to an exemplary embodiment of the present invention.

FIG. 2 is a circuit diagram of a wordline driving circuit according to an exemplary embodiment of the present invention.

Referring to FIG. 2, a wordline driving circuit 200 includes an address decoding signal generator 210 and a wordline voltage supplier 220. The wordline voltage supplier 220 is the same as the wordline voltage supplier 110 in FIG. 1.

The address decoding signal generator 210 includes an inverter chain having first and second inverters 211 and 212. The first inverter 211 includes a PMOS transistor P1 and an NMOS transistor N1. The second inverter 212 includes a PMOS transistor P2, an NMOS transistor N2, and an NMOS transistor Nc. The NMOS transistor Nc is connected between the PMOS transistor P2 and the NMOS transistor N2 and is turned on/off according to a control signal CTRL. Although an NMOS transistor is used in this exemplary embodiment, a PMOS transistor could also be used by adjusting the control signal CTR.

Unlike the second inverter 112 in FIG. 1, the second inverter 212 is controlled by the control signal CTRL. That is, PXID signal has one of a high level, a low level, and a floating state according to the control signal CTRL. When the control signal CTRL has a high level, the PXID signal has a high level or a low level. On the other hand, when the control signal CTRL has a low level, the PXID signal has a floating state.

In a standby mode, that is, when a wordline WL is in an inactive state, the wordline driving circuit 200 sets the control signal CTRL to a low level for a predetermined time. At this point, the PXID signal in a floating state for a predetermined time. When the PXID signal is in a floating state, a GIDL current generated at a PMOS transistor P3 of the wordline voltage supplier 220 is reduced. That is, a GIDL current generated at a source of the PMOS transistor P3 is removed.

Figure 3:
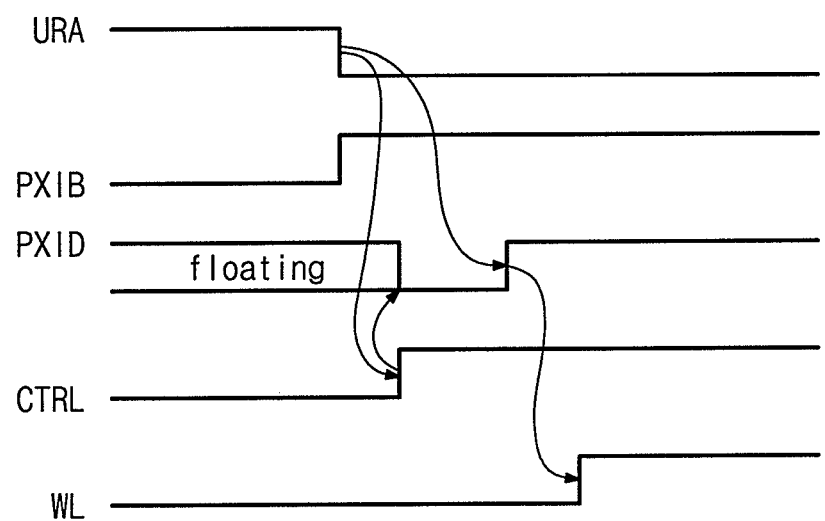
FIG. 3 is a timing diagram illustrating an operation of the wordline driving circuit illustrated in FIG. 2.

FIG. 3 is a timing diagram illustrating an operation of the wordline driving circuit 200 illustrated in FIG. 2.

Referring to FIG. 3, the PXID signal is activated by the URA signal and then the wordline WL is activated by the PXID signal. The control signal CTRL is activated in response to the URA signal.

In an initial state before the activation of the control signal CTRL, the PXID signal is in a floating state. The reason for this is that the NMOS transistor Nc shown in FIG. 2 is in a turn-off state according to the low-level control signal CTRL. A GIDL current is not generated at the source of the PMOS transistor P3 shown in FIG. 2 while the PXID signal is in a floating state.

The control signal CTRL is activated to a high level by the URA signal. When the control signal CTRL is activated, the NMOS transistor Nc is turned on. As illustrated in FIG. 3, at the time when the control signal CTRL is activated to a high level, the PXIB signal is already set to a high level. Therefore, because the PXID signal is grounded through the NMOS transistor N2 shown in FIG. 2, it becomes a low level in a floating state.

According to exemplary embodiments of the present invention, the wordline driving circuit 200 sets the PXID signal to a floating state in the standby mode, thereby reducing the GIDL current. In addition, the wordline driving circuit 200 sets the PXID signal to a low level before the activation of the wordline WL, thereby preparing the wordline activation operation. Exemplary embodiments of the present invention can also be applied to a wordline driving circuit, with a sub word line driver structure, as well as to the wordline driving circuit 200 shown in FIG 2.

As described above, the wordline driving circuit according to exemplary embodiments of the present invention provides a unit for setting the PXID signal to a floating state in the standby mode, thereby reducing the GIDL current.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A wordline driving circuit for a semiconductor memory, comprising:
   an address decoding signal generator receiving a first row address decoding signal (URA) and generating a delayed URA signal (PXID); and
   a wordline voltage supplier having a pull-up transistor for providing the PXID signal to a selected wordline in response to a second row address decoding signal (LRA),
   wherein the address decoding signal generator sets the PXID signal to a floating state before the selection of the wordline to prevent a leakage current from flowing through the pull-up transistor in a standby mode.

2. The wordline driving circuit of claim 1, wherein the address decoding signal generator comprises an inverter chain.

3. The wordline driving circuit of claim 2, wherein the inverter chain sets the PXID signal to a floating state in response to a control signal generated from the URA signal.

4. The wordline driving circuit of claim 3, wherein the inverter chain generates the URA signal, the PXID signal, and an inverted PXID signal (PXIB).

5. The wordline driving circuit of claim 4, wherein the inverter chain comprises:
   a first inverter comprises a first PMOS transistor and a first NMOS transistor to receive the URA signal and generate the PXIB signal; and
   a second inverter comprises a second PMOS transistor and a second NMOS transistor to receive the PXIB signal and generate the PXID signal,
   wherein the second inverter further comprises a MOS transistor connected between the second PMOS transistor and the second NMOS transistor to set the PXID signal to a floating state in response to the control signal fed thereto.

6. The wordline driving circuit of claim 5, wherein the MOS transistor is an NMOS transistor.

7. The wordline driving circuit of claim 6, wherein the PXID signal is set to a low level when the control signal changes from a low level to a high level according to the URA signal.

8. The wordline driving circuit of claim 1, wherein the pull-up transistor is a PMOS transistor.

9. The wordline driving circuit of claim 1, wherein the semiconductor memory is a dynamic random access memory (DRAM).

10. A wordline driving method for a semiconductor memory, which includes an address decoding signal generator receiving a first row address decoding signal (URA) and generating a delayed URA signal (PXID), and a wordline voltage supplier having a pull-up transistor for providing the PXID signal to a selected wordline in response to a second row address decoding signal (LRA), the wordline driving method comprising:
    setting the PXID signal to a floating state before the selection of the wordline to prevent a leakage current from flowing through the pull-up transistor in a standby mode;
    setting the PXID signal to a low level in response to a control signal generated from the URA signal; and
    setting the PXID signal to a high level by the URA signal and driving the selected wordline.

11. The wordline driving method of claim 10, wherein the pull-up transistor is a PMOS transistor.

12. The wordline driving method of claim 10, wherein the semiconductor memory is a dynamic random access memory (DRAM).

* * * * *